(12) United States Patent
Ho et al.

(10) Patent No.: US 9,793,278 B1
(45) Date of Patent: Oct. 17, 2017

(54) STRUCTURE OF MEMORY CELL WITH ASYMMETRIC CELL STRUCTURE AND METHOD FOR FABRICATING THE SAME

(71) Applicant: United Microelectronics Corp., Hsinchu (TW)

(72) Inventors: Yen-Ting Ho, Taipei (TW); Sung-Bin Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/140,029

(22) Filed: Apr. 27, 2016

(51) Int. Cl.
| | |
|---|---|
| *H01L 29/66* | (2006.01) |
| *H01L 27/11* | (2006.01) |
| *H01L 27/11521* | (2017.01) |
| *H01L 27/11558* | (2017.01) |
| *H01L 29/78* | (2006.01) |
| *H01L 29/423* | (2006.01) |

(52) U.S. Cl.
CPC .. *H01L 27/11521* (2013.01); *H01L 27/11558* (2013.01); *H01L 29/42328* (2013.01); *H01L 29/6656* (2013.01); *H01L 29/66492* (2013.01); *H01L 29/7835* (2013.01)

(58) Field of Classification Search
CPC ... H01L 29/42; H01L 29/42324; H01L 29/78; H01L 29/7883; H01L 27/11; H01L 27/115; H01L 27/11521; H01L 27/11558; H01L 29/423; H01L 29/4232; H01L 29/42328; H01L 29/66; H01L 29/664; H01L 29/6649; H01L 29/66492; H01L 29/665; H01L 29/6656
USPC ........................................................ 257/318
See application file for complete search history.

(56) References Cited

U.S. PATENT DOCUMENTS

| | | | |
|---|---|---|---|
| 5,793,090 A | 8/1998 | Gardner et al. | |
| 5,930,592 A | 7/1999 | Kadosh et al. | |
| 7,084,015 B2 * | 8/2006 | Nguyen | .......... H01L 21/823425 257/E21.62 |
| 8,518,782 B2 | 8/2013 | Botula et al. | |
| 9,000,525 B2 * | 4/2015 | Wen | ................ H01L 21/823456 257/368 |

* cited by examiner

*Primary Examiner* — Monica D Harrison
(74) *Attorney, Agent, or Firm* — J.C. Patents

(57) ABSTRACT

A memory cell disposed on a substrate has a first gate structure and a second gate structure. The memory cell includes a first heavily doped region adjacent to an outer side of the first gate structure. Further, a first lightly doped drain (LDD) region with a first type dopant is between the first heavily doped region and the outer side of the first gate structure. A pocket doped region with a second type dopant is overlapping with the first LDD region. The second type dopant is opposite to the first type dopant in conductive type. A second heavily doped region is adjacent to an outer side of the second gate structure, opposite to the first heavily doped region. A second LDD region with the first type dopant is disposed between the first gate structure and the second gate structure.

22 Claims, 4 Drawing Sheets

US 9,793,278 B1

STRUCTURE OF MEMORY CELL WITH ASYMMETRIC CELL STRUCTURE AND METHOD FOR FABRICATING THE SAME

BACKGROUND OF THE INVENTION

1. Field of the Invention

The present invention generally relates to semiconductor memory, in particular, to a structure of memory cell with asymmetric cell structure and method for fabricating the memory cell.

2. Description of Related Art

The flash memory cell can be formed by two stacked gate structures on a substrate, also known as 2T memory cell, to improve performance, in which each gate structure is stacked by a lower gate and an upper gate. One of the two gate structures server as a selection gate, in which only the lower gate is applied with a selection voltage to select this cell and the upper gate is not used. Another one of the two gate structures is used to store the binary data, in which the lower gate is a floating gate for storing data and the upper gay is applied with a control voltage to perform reading operation, writing operation and erasing operation.

However, the conventional structure for the memory cell with two gate structures may get worse in performance after a certain number of operations. In other words, the life time is not long enough.

How to design a memory cell with better performance is still under developing in the art.

SUMMARY OF THE INVENTION

Accordingly, the present invention is directed to a memory cell, which may at least have longer life time.

The invention provides a structure of memory cell, disposed on a substrate, having a first gate structure and a second gate structure adjacent to the first gate structure. The structure includes a first heavily doped region in the substrate adjacent to an outer side of the first gate structure. Further, a first lightly doped drain (LDD) region with a first type dopant is disposed in the substrate between the first heavily doped region and the outer side of the first gate structure. A pocket doped region with a second type dopant is formed in the substrate overlapping with the first LDD region, wherein the second type dopant is opposite to the first type dopant in conductive type. A second heavily doped region is formed in the substrate adjacent to an outer side of the second gate structure, opposite to the first heavily doped region. A second LDD region is formed in the substrate with the first type dopant, disposed between the first gate structure and the second gate structure. The first heavily doped region and the second heavily doped region are in same conductive type.

The invention also provides a method for fabricating a memory cell, wherein the memory cell on a substrate has a first gate structure and a second gate structure adjacent to the first gate structure. The method includes: Ruining a first light doped drain (LDD) region with a first type dopant in the substrate at an outer side of the first gate structure; forming a pocket doped region with a second type dopant in the substrate, overlapping with the first LDD region, wherein the second type dopant is opposite to the first type dopant in conductive type; forming a second LDD region in the substrate with the first type dopant, disposed between the first gate structure and the second gate structure; foil ring a first heavily doped region in the substrate adjacent to the outer side of the first gate structure and a second heavily doped region in the substrate adjacent to an outer side of the second gate structure, wherein the first heavily doped region and the second heavily doped region are in same conductive type.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
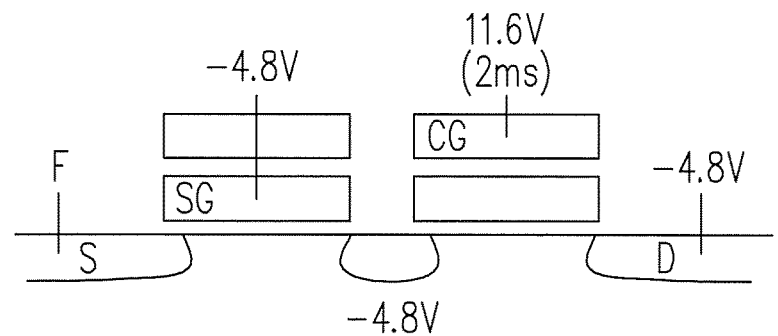
FIG. 1A to FIG. 1C are drawings, schematically illustrating an operation mechanism for a memory cell with a structure of dual gate, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The technology to fabricate a memory cell has been developed. In the development, the memory cell with dual structure, or also referred as 2T memory cell in some situations, has been propped. The invention has further investigated into the memory cell in performance. However, after investigation in the invention, the convention memory cell with dual gate structure indeed has some issues, which are not in well conditions and need to be improved. Before describing the proposed structure memory cell with dual gate structure in detail, the issues for the memory with symmetric cell structure investigated in the invention are briefly addressed first.

Figure 1B:
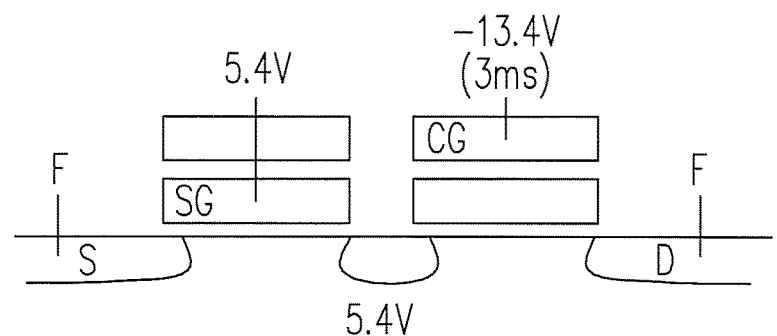
Figure 1C:
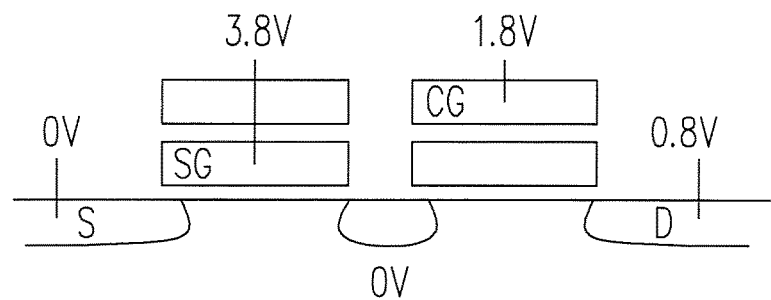

FIG. 1A to FIG. 1C are drawings, schematically illustrating an operation mechanism for a memory cell with a structure of dual gate, according to an embodiment of the invention. Referring to FIG. 1A, the memory cell with the structure of dual gate includes a two adjacent gate structures as briefly shown. Each of the gate structure is stacked by a lower gate and an upper gate. One of the two adjacent gate structures is serving as a selection gate (SG) using the lower gate. Another one of the two adjacent gate structures is for actually storing data, in which the lower gate is a floating gate to store data and the upper gate serves as the control gate (CG) to control the floating gate in response to the operation as intended, such as reading, writing or erasing.

As an example for writing (or programming) operation, the source region S of the selection gate (SG) is floating (F), and the selection gate (SG) is applied with −4.8 V. The doped regions in the substrate at two sides of the gate structure of control gate (CG) are applied with −4.8 V as well, in which one of the doped region is serving as the drain region. The control gate (CG) is then applied with a voltage of 11.6V for 2 ms. The operation voltage produces a current to store a amount of electrons in the floating gate under the control gate (CG), so the binary data is stored in the floating gate.

In erasing operation, as referring to FIG. 1B, the selection gate (SG) is applied with 5.4 v. The control gate is applied with a voltage level of −13.4V for 3 ms. The source region (S) and the drain region (D) are set to be floating while the doped region between the two adjacent gate structures is set to 5.4 V. As a result, the electrons in the floating gate can be drained away.

In the reading operation, as referring to FIG. 1C, the selection gate (SG) is applied with a voltage level of 3.8 V and the control gate (CG) is applied with a voltage level of 1.8V. The doped region between the two adjacent gate structures is set to 0V. The source region (S) is applied with a voltage level of 0V and the drain region (D) is applied with a voltage level of 0.8V.

The operations above would be performed for a large number of times (also referred as a cycle) in actual use. However, the above memory structure with the operations is in an ideal condition, in which the spacer on the sidewall of the gate structure would be included. Then, after a certain number of operation cycles, the performance of memory would get worse and then get failure. The reasons would be further described in following descriptions.

Figure 2:
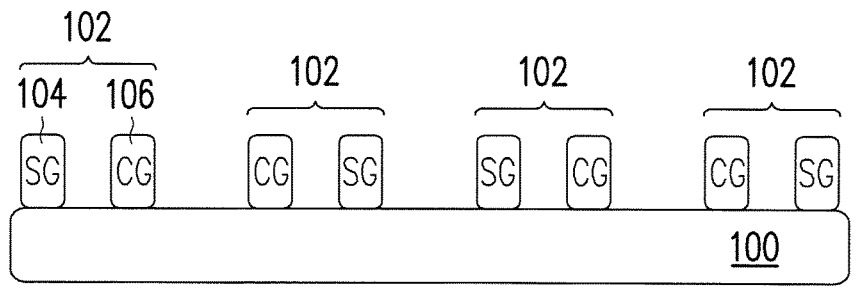
FIG. 2 is a drawing, schematically illustrating an arrangement of gate array for the memory cell with dual gate, according to an embodiment of the invention.

For the structure on a substrate, the gates are arranged in a form of array. FIG. 2 is a drawing, schematically illustrating an arrangement of gate array for the memory cell with dual gate, according to an embodiment of the invention. Referring to FIG. 2, a memory cell 102 includes a gate structure 104 serving as a selection gate (SG) and another gate structure 106 serving as the control gate (CG). Usually, the two gate structures are alternately changed cell after cell. In other words, as to a line array, the dual gates for the memory cells 102 are arranged by (SG, CG), (CG, SG), (SG, CG), (CG, SG), . . . , (SG, CG), (CG, SG).

Figure 3:
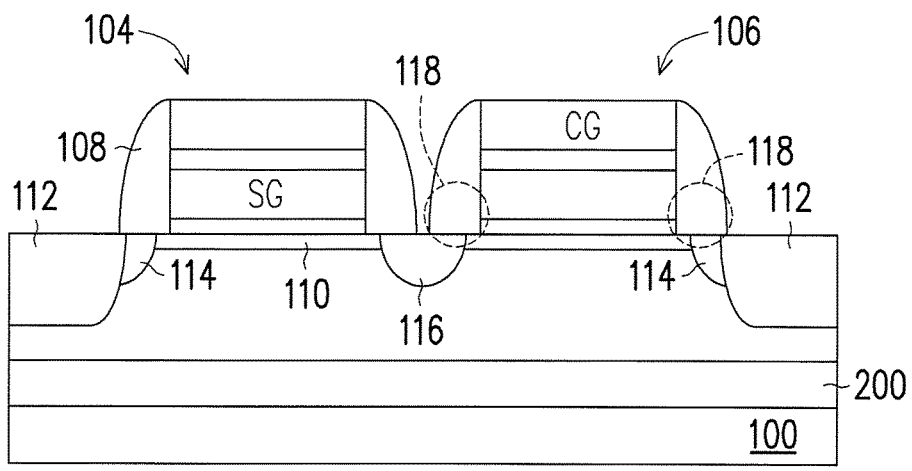
FIG. 3 is a drawing, schematically illustrating a cross-sectional structure for a memory cell with symmetric cell structure, according to an embodiment of the invention.

FIG. 3 is a drawing, schematically illustrating a cross-sectional structure for a memory cell with symmetric cell structure, according to an embodiment of the invention. Referring to FIG. 3, the usual structure for the memory cell with symmetric cell structure is described and investigated. The gate structures 104 and 106 of the memory cell also include the spacers 108 on the sidewalls. The substrate 100 with the effects of the spacers 108 and the photoresist mask is implanted to form various doped regions, including the source/drain regions 112 for the memory cell and the multiple lightly doped drain (LDD) regions 114, 116. Also, a doped layer region 110 is formed for adjusting the threshold voltage (VT) of the memory cell and an anti-punch doped layer region 200 is also formed.

It can be noted that the structure of the memory cell with dual gates shown in FIG. 3 is known as the symmetric cell structure. Particularly, the structure for the doped regions in the substrate 100 is symmetric. The invention has investigated into this structure and found that at least the threshold voltage (VT) of the memory cell would shift up after a certain large number of operation cycle, such as ten thousand times of operation in programming and erasing. The change of the threshold voltage (VT) would cause the error judgement of the binary data stored in the memory, in which the threshold voltage (VT) determines whether the cell is conducted or not, which are corresponding to the two states of binary data. In other words, when the threshold voltage (VT) is shifted over a level, it then causes the error of the binary data in programming and erasing.

As investigated in the invention, the residual electrons may still be trapped in a region 118, such as the spacer 108 or even the gate dielectric layer. The invention further study the VT shift in relating with the doped level for the doped regions. As found, when the S/D region is implanted with higher level, it can reduce the increase of the threshold voltage (VT) after a certain large number of programming/erasing cycles. However, the increase of S/D implantation has at least the risk that the punch current would occur and the BVD at the PN junction would be breakdown.

The invention then proposes a structure of memory cell with asymmetric cell structure. Several embodiments are provided for describing the invention but not for limitations.

Figure 4:
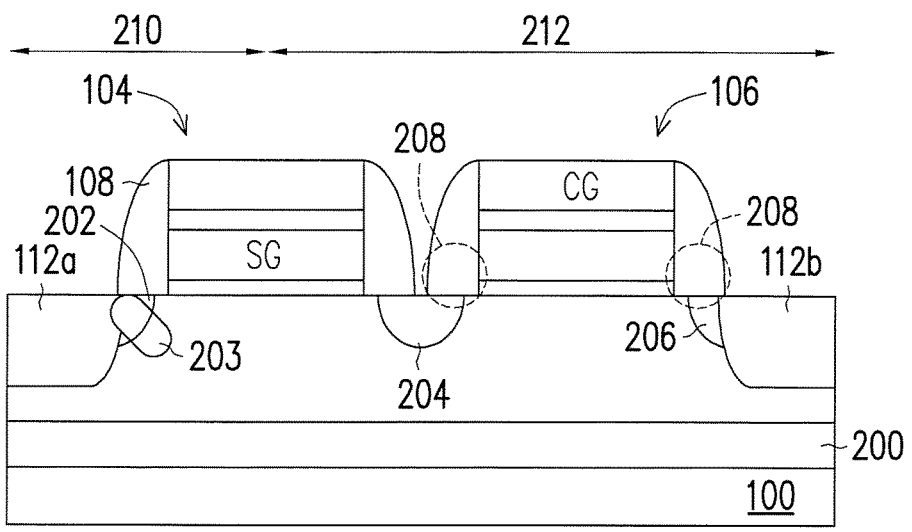
FIG. 4 is a drawing, schematically illustrating a cross-sectional structure for a memory cell with asymmetric cell structure, according to an embodiment of the invention.

FIG. 4 is a drawing, schematically illustrating a cross-sectional structure for a memory cell with asymmetric cell structure, according to an embodiment of the invention. Referring to FIG. 4, a memory cell with dual gates is disposed on a substrate 100. Before forming the memory cell, an anti-punch doped layer region 200 may be formed in the substrate 100 at a depth, first. The anti-punch doped layer region 200 can also be a global doped region, generally. The memory cell has a first gate structure 104 and a second gate structure 106 adjacent to the first gate structure 104. The spacers 108 are formed on sidewalls of the first and second gate structures 104, 106. The structure of the memory cell includes a first heavily doped region 112a in the substrate adjacent to an outer side of the first gate structure 104. Further, a first lightly doped drain (LDD) region 202 with a first type dopant is disposed in the substrate 100 between the first heavily doped region 112a and an outer side of the first gate structure 104. A pocket doped region 203 with a second type dopant is formed in the substrate 100 overlapping with the first LDD region 202, wherein the second type dopant is opposite to the first type dopant in conductive type. A second heavily doped region 112b is formed in the substrate 100 adjacent to an outer side of the second gate structure 106, opposite to the first heavily doped region 112a. A second LDD region 204 is formed in the substrate with the first type dopant, disposed between the first gate structure 104 and the second gate structure 106. A third LDD 206 is also formed in the substrate 100 between the outer side of the second gate structure 106 and the second heavily doped region 112b. The first heavily doped region 112a and the second heavily doped region 112b are in same conductive type and serves as the source/drain regions. For example, the first heavily doped region 112a serves as the source region (S) and the second heavily doped region 112b serves as the source region (D).

Remarkably, the doped layer region 110 for adjusting the threshold voltage (VT) shown in FIG. 3 is omitted. Further, the first LDD region 202 with the pocket doped region 203 is formed, asymmetric to the third LDD 206. The pocket doped region 203 can be formed by implantation with a tilt angle, so the profile of the pocket doped region 203 is slant into the substrate 100. As a result, the residual electrons at the region 208 can be significantly reduced even after a large number of programming/erasing cycles. In other words, the threshold voltage (VT) does not significantly increase. In other words, the two states of the binary data corresponding to the stored charges can be correctly distinct with respect to the reference threshold voltage even after large number of programming/erasing cycles.

The asymmetric structure for the doped regions can be formed by use of two photoresist implantation mask. For example, the memory cell can be divided into a first region 210 with a mask for forming the first LDD region 202 and the pocket doped region 203 and a second region 212 forming the second LDD region 204 and the third LDD region 206. Here, the implantation with photoresist mask may be compatible with the implantation for the circuit device or any other core device, so the implantation can be performed at the same time. In this situation, the implantation process for the memory cell may skip some additional photoresist masks. However, it is not the limitation.

Figure 5A:
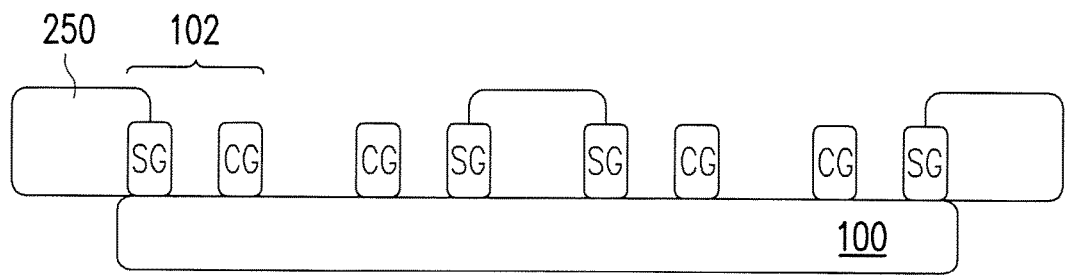
FIG. 5A is drawing, schematically illustrating an implanting mechanism for the memory cell with dual gate, according to an embodiment of the invention.
Figure 5B:
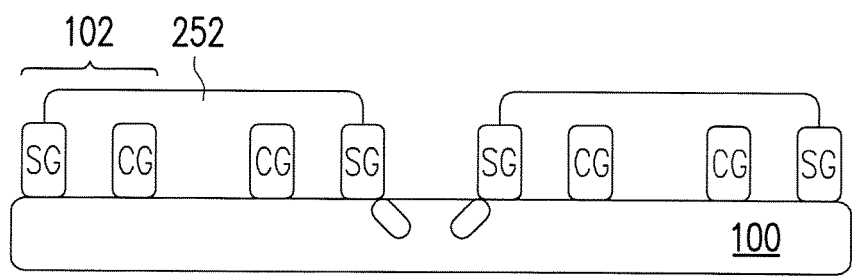
FIG. 5B is drawing, schematically illustrating an implanting mechanism for the memory cell with dual gate, according to an embodiment of the invention.
Figure 6:
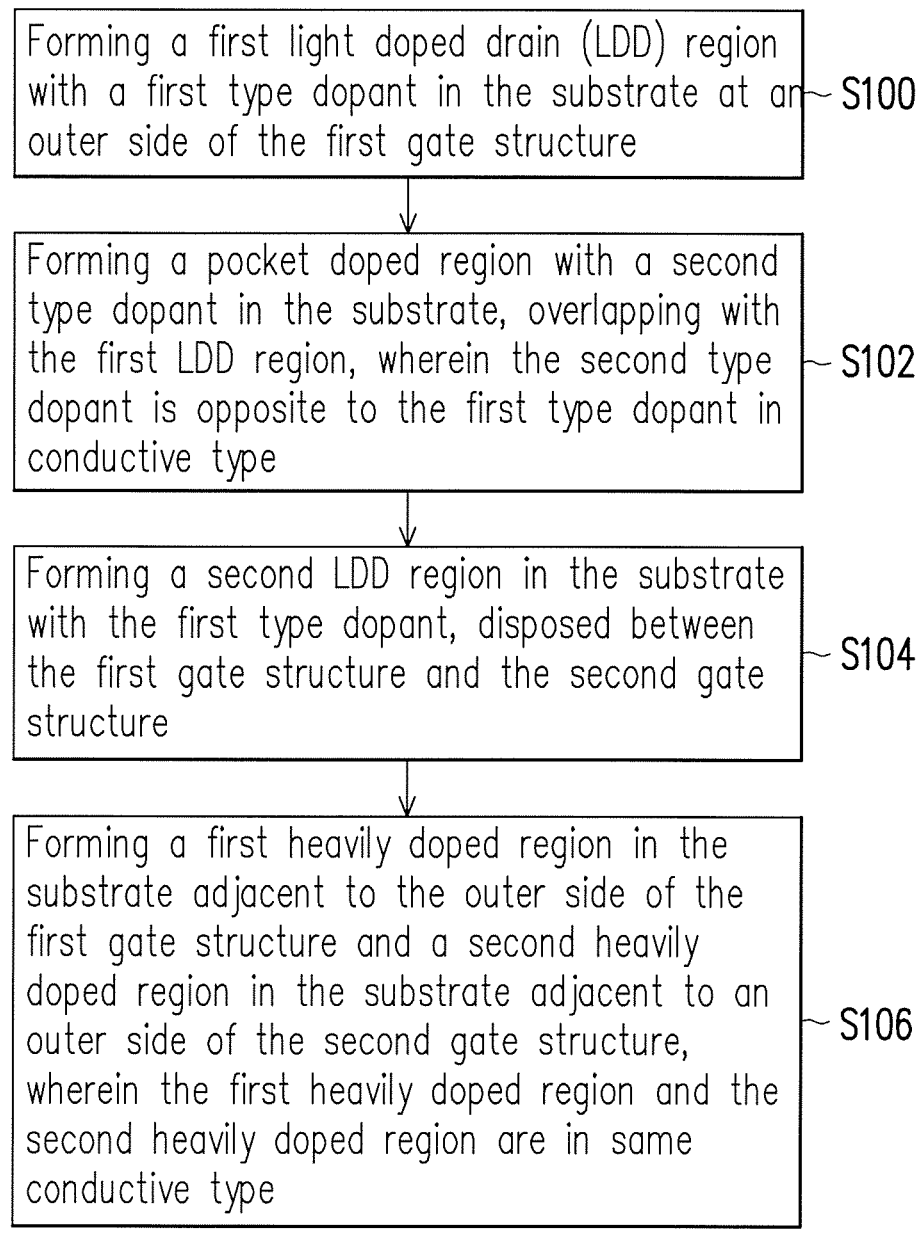
FIG. 6 is drawing, schematically illustrating the steps of a method for fabrication a memory cell, according to an embodiment of the invention.

FIG. 5A is drawing, schematically illustrating an implanting mechanism for the memory cell with dual gate, according to an embodiment of the invention. FIG. 5B is drawing, schematically illustrating an implanting mechanism for the memory cell with dual gate, according to an embodiment of the invention. Referring to FIG. 5A, the photoresist mask 250 is used to mask one sidewall of each gate structure including the selection gate (SC), so the LDD regions adjacent to the control gate (CG) and the LDD region between the selection gate (SG) and the control gate (CG) in the same memory cell can be formed by implantation. In FIG. 5B, another photoresist mask 252 is used as the mask for implanting the substrate 100 at the region adjacent to the selection gate (SG) in each memory cell, so the pocket doped region can be additional formed.

About the conductive type of the dopant and the dopant concentration for the memory cell with asymmetric cell structure are listed in table 1 as an example, which can be compared with the condition for the memory cell in symmetric cell structure, listed in Table 2.

TABLE 1

Asymmetric cell structure

|  | Dopant | Energy | Concentration (cm$^{-3}$) |
|---|---|---|---|
| Cell VT | none | none | none |
|  | B (p) | 60 to 90 Kev | 200 to 500 (×10$^{13}$) |
| Cell LDD (regions 204, 206) | P (n) | 10 to 30 Kev | 700 to 1000 (×10$^{13}$) |
| CoreLDD/Pocket (regions 202, 203) | BF (p) As (n) | 50 to 75 Kev 4 to 8 Kev | 250 to 500 (×10$^{13}$); QT30 100 to 300 (×10$^{15}$) |

QT: implanting angle

TABLE 2

Symmetric cell structure

|  | Dopant | Energy | Concentration (cm$^{-3}$) |
|---|---|---|---|
| Cell VT (region 110) | BF (p) B (p) | 30 to 60 Kev 60 to 90 Kev | 50 to 350 (×10$^{13}$) 200 to 500 (×10$^{13}$) |
| Cell LDD (region 114, 116) | P (n) | 35 to 55 Kev | 200 to 500 (×10$^{13}$) |
| Core NLDD | none | none | none |

As can be seen in Table 1, the core LDD region 202 in the example has the concentration about a factor of 15-30 higher than the cell LDD, that is, the LDD regions 204 and 206. In other hand, when considering the cell LDD in Table 2, a concentration ratio of the core LDD region 202 to the cell LDD regions 204 and 206 is less than 50. This means that the LDD regions 204 and 206 have higher concentration than the concentration in Table 2 for the symmetric cell structure, shown in FIG. 3. Due to the reduced depth at the LDD region 204, the cross-section area of the channel is reduced as well. As a result, the current punch through the channel is al reduced.

Further in comparing Table 1 for asymmetric cell structure with Table 2 for symmetric cell structure in better detail. The LDD region 204 between the two gate structures 104, 106 of the same memory cell has the concentration of 700×10$^{13}$ cm$^{-3}$ to 1000×10$^{13}$ cm$^{-3}$ in table 1 higher than the concentration of 200×10$^{13}$ cm$^{-3}$ to 500×10$^{13}$ cm$^{-3}$ in Table 2. So, the LDD region 204 for the asymmetric cell structure in FIG. 4 can be shallower.

The pocket doped region 203 is in P-type conductivity, such as BF, while the LDD region 202 is in N-type conductivity, such as As. Further, the pocket doped region is slant because the implanting angle (QT) can be 30 degrees in an example. The channel threshold voltage (VT) at the source side with selection gate (SG) can be controlled by the pocket doped region. The doped layer region 110 in FIG. 3 for adjusting the threshold voltage (VT) is skipped, so it gains higher cell current.

After various tests for the memory cell with asymmetric cell structure as for example shown in FIG. 4, the memory cell in higher probability can still correctly store the data after a large number of programming/erasing cycles, such as 10,000 times.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of memory cell, disposed on a substrate, a memory cell having a first gate structure of a first transistor and a second gate structure of a second transistor being adjacent to the first gate structure, the structure comprising:
   a first heavily doped region in the substrate adjacent to an outer side of the first gate structure, not between the first gate structure and the second gate structure;
   a first lightly doped drain (LDD) region with a first type dopant, disposed in the substrate between the first heavily doped region and the outer side of the first gate structure;
   a pocket doped region with a second type dopant, in the substrate overlapping with the first LDD region, wherein the second type dopant is opposite to the first type dopant in conductive type;
   a second heavily doped region in the substrate adjacent to an outer side of the second gate structure, opposite to the first heavily doped region, wherein the second heavily doped region is not between the first gate structure and the second gate structure, and no further heavily doped region is between the first gate structure and the second gate structure; and
   a second LDD region in the substrate with the first type dopant, disposed between the first gate structure and the second gate structure,
   wherein the first heavily doped region and the second heavily doped region are in same conductive type.

2. The structure of memory cell as recited in claim 1, further comprising a global doped region in the substrate, configured to reduce punch probability for the memory cell.

3. The structure of memory cell as recited in claim 1, not comprising a global doped region in the substrate with same conductive type of the second type dopant for adjusting threshold voltage for the memory cell.

4. The structure of memory cell as recited in claim 1, wherein the first LDD region in dopant concentration is higher than the second LDD region.

5. The structure of memory cell as recited in claim 4, wherein the first LDD region in dopant concentration is higher than the second LDD region by a factor of 15-30.

6. The structure of memory cell as recited in claim 1, wherein the first gate structure comprises a selection gate, and the second gate structure comprises a stack of a floating gate and a control gate.

7. The structure of memory cell as recited in claim 1, wherein a plurality of spacers is disposed on sidewalls of the first gate structure and the second gate structure.

8. The structure of memory cell as recited in claim 1, wherein the pocket doped region in a slant direction is deeper than the first LDD region.

9. The structure of memory cell as recited in claim 1, wherein the second LDD region has dopant concentration in a rang of 700×1013 cm-3 to 1000×1013 cm-3.

10. The structure of memory cell as recited in claim 1, wherein the second LDD region has dopant concentration at least 700×1013 cm-3.

11. The structure of memory cell as recited in claim 1, further comprising a third LDD region in the substrate with the first type dopant, disposed at the outer side of the second gate structure.

12. A method for fabricating a memory cell, wherein a memory cell on a substrate has a first gate structure of a first transistor and a second gate structure of a second transistor being adjacent to the first gate structure, the method comprising:
    forming a first light doped drain (LDD) region with a first type dopant in the substrate at an outer side of the first gate structure;
    forming a pocket doped region with a second type dopant in the substrate, overlapping with the first LDD region, wherein the second type dopant is opposite to the first type dopant in conductive type;
    forming a second LDD region in the substrate with the first type dopant, disposed between the first gate structure and the second gate structure; and
    forming a first heavily doped region in the substrate adjacent to the outer side of the first gate structure, not between the first gate structure and the second gate structure and a second heavily doped region in the substrate adjacent to an outer side of the second gate structure, not between the first gate structure and the second gate structure, and no further heavily doped region is between the first gate structure and the second gate structure, wherein the first heavily doped region and the second heavily doped region are in same conductive type.

13. The method for fabricating the memory cell as recited in claim 12, further comprising performing a global doping process to form a doped region in the substrate to reduce punch probability for the memory cell.

14. The method for fabricating the memory cell as recited in claim 12, not performing global doping process to form a global doped region in the substrate with same conductive type of the second type dopant for adjusting threshold voltage for the memory cell.

15. The method for fabricating the memory cell as recited in claim 12, wherein the first LDD region in dopant concentration is formed to be higher than the second LDD region by performing a first implanting process with a first photoresist layer and a second implanting process with a second photoresist layer.

16. The method for fabricating the memory cell as recited in claim 15, the first LDD region in dopant concentration is higher than the second LDD region by a factor of 15-30.

17. The method for fabricating the memory cell as recited in claim 12, further comprising a procedure to form the first gate structure and the second gate structure, wherein the first gate structure comprises a selection gate and the second gate structure comprises a stack of a floating gate and a control gate.

18. The method for fabricating the memory cell as recited in claim 12, further comprising forming a plurality of spacers on sidewalls of the first gate structure and the second gate structure.

19. The method for fabricating the memory cell as recited in claim 12, wherein a tilt implanting process is performed to form the pocket doped region in a slant direction and deeper than the first LDD region.

20. The method for fabricating the memory cell as recited in claim 12, wherein the second LDD region has dopant concentration in a rang of 700×1013 cm-3 to 1000×1013 cm-3.

21. The method for fabricating the memory cell as recited in claim 12, wherein the second LDD region has dopant concentration at least 700×1013 cm-3.

22. The method for fabricating the memory cell as recited in claim 12, further comprising forming a third LDD region in the substrate with the first type dopant, disposed at the outer side of the second gate structure wherein the third LDD region is formed at the same time as the second LDD region.

\* \* \* \* \*